(12) United States Patent
Qu et al.

(10) Patent No.: US 11,832,475 B2
(45) Date of Patent: Nov. 28, 2023

(54) FLEXIBLE ELECTRONIC DISPLAY DEVICE

(71) Applicant: The Regents of the University of Michigan, Ann Arbor, MI (US)

(72) Inventors: Yue Qu, Ann Arbor, MI (US); Xiaheng Huang, Ann Arbor, MI (US); Stephen R. Forrest, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 17/826,722

(22) Filed: May 27, 2022

(65) Prior Publication Data
US 2022/0367836 A1    Nov. 17, 2022

Related U.S. Application Data

(63) Continuation of application No. 16/752,553, filed on Jan. 24, 2020, now Pat. No. 11,349,099.
(Continued)

(51) Int. Cl.
*H10K 50/854*    (2023.01)
*H10K 50/11*    (2023.01)
(Continued)

(52) U.S. Cl.
CPC ........... *H10K 50/854* (2023.02); *H10K 50/11* (2023.02); *H10K 71/00* (2023.02); *H10K 71/80* (2023.02);
(Continued)

(58) Field of Classification Search
None
See application file for complete search history.

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| EP | 1238981 | 9/2002 |
| JP | 2010135467 | 6/2010 |

(Continued)

OTHER PUBLICATIONS

Adachi, C., Baldo, M., Thompson, M.E., & Forrest, S. (2001). Nearly 100% internal phosphorescence efficiency in an organic light emitting device. Journal of Applied Physics, 90, 5048-5051.
(Continued)

*Primary Examiner* — Erik Kielin
(74) *Attorney, Agent, or Firm* — Riverside Law LLP

(57) ABSTRACT

A method of fabricating a light emitting device comprises providing a mold having an unpolished surface with an arithmetic mean roughness $R_a$ in a range from 0.1 μm to 10 μm, depositing a thin polymer film over the surface of the mold, wherein the film has a thickness in a range from 1 μm to 100 μm, positioning a light emitting body onto the thin polymer film, wherein the light emitting body includes an anode, a cathode, and a light emitting layer positioned between the anode and the cathode, and separating the thin polymer film with the light emitting body from the mold. A light emitting device is also described.

17 Claims, 11 Drawing Sheets

Related U.S. Application Data

(60) Provisional application No. 62/797,018, filed on Jan. 25, 2019.

(51) Int. Cl.
  *H10K 77/10* (2023.01)
  *B29L 31/34* (2006.01)
  *B29C 41/02* (2006.01)
  *H10K 101/10* (2023.01)
  *H10K 102/00* (2023.01)
  *H10K 71/00* (2023.01)
  *H10K 71/80* (2023.01)

(52) U.S. Cl.
  CPC ............ *H10K 77/111* (2023.02); *B29C 41/02* (2013.01); *B29L 2031/3475* (2013.01); *H10K 71/821* (2023.02); *H10K 2101/10* (2023.02); *H10K 2102/311* (2023.02)

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 2003/0027967 A1 | 2/2003 | Hori |
| 2003/0230980 A1 | 12/2003 | Forrest |
| 2004/0174116 A1 | 9/2004 | Lu |
| 2008/0158682 A1* | 7/2008 | Egi ............... G02B 26/026 349/137 |
| 2012/0292652 A1* | 11/2012 | Yamae ............ H10K 50/856 257/98 |
| 2013/0026452 A1 | 1/2013 | Kottas |
| 2013/0119354 A1 | 5/2013 | Ma |
| 2015/0179987 A1 | 6/2015 | Ma |
| 2015/0210048 A1* | 7/2015 | Jeong ............ C03C 17/3405 428/212 |
| 2015/0295202 A1 | 10/2015 | Ma |
| 2016/0096193 A1 | 4/2016 | Chan |
| 2016/0141528 A1* | 5/2016 | Masuyama ...... H10K 50/85 257/40 |
| 2016/0181569 A1 | 6/2016 | Wu |
| 2017/0133292 A1 | 5/2017 | Baker |
| 2017/0159178 A1 | 6/2017 | Baker |
| 2017/0229663 A1 | 8/2017 | Tsai |
| 2018/0097202 A1* | 4/2018 | Forrest .......... H10K 50/854 |
| 2019/0345056 A1 | 11/2019 | Cao |

FOREIGN PATENT DOCUMENTS

| | | |
|---|---|---|
| WO | 2004111066 A1 | 12/2004 |
| WO | 2008044723 | 4/2008 |
| WO | 2008057394 A1 | 5/2008 |
| WO | 2010011390 A2 | 1/2010 |
| WO | 2010111175 | 9/2010 |

OTHER PUBLICATIONS

Baldo et al., "Highly Efficient Phosphorescent Emission from Organic Electroluminescent Devices," Nature, vol. 395, pp. 151-154 (1998).

Baldo et al., "Very High-Efficiency Green Organic Light-Emitting Devices Based on Electrophosphorescence," Appl. Phys. Lett, vol. 75, No. 1, pp. 4-6 (1999).

Formula for arithmetic mean surface roughness Ra as obtained from JIS B 0601 (1994) and JIS B 0031(1994) in the article "A Guide to Understanding Surface Roughness Measurement Types" available at https://roslerblog.com/2016/05/27/surface-roughness-measurement/ (Year: 1994).

Forrest, S. The path to ubiquitous and low-cost organic electronic appliances on plastic. Nature 428, 911-918 (2004). https://doi.org/10.1038/nature02498.

Forrest, S., Bradley, D. and Thompson, M. (2003), Measuring the Efficiency of Organic Light-Emitting Devices. Adv. Mater., 15: 1043-1048. https://doi.org/10.1002/adma.200302151.

G. E. Loeb, M. J. Bak, M. Salcman and E. M. Schmidt, "Parylene as a Chronically Stable, Reproducible Microelectrode Insulator," in IEEE Transactions on Biomedical Engineering, vol. BME-24, No. 2, pp. 121-128, Mar. 1977, doi: 10.1109/TBME.1977.326115.

G. Gu, P. E. Burrows, S. Venkatesh, S. R. Forrest, and M. E. Thompson, "Vacuum-deposited, nonpolymeric flexible organic light-emitting devices," Opt. Lett. 22, 172-174 (1997).

Han, T. H., Lee, Y., Choi, M. R., Woo, S. H., Bae, S. H., Hong, B. H., Ahn, J. H., & Lee, T. W. (2012). Extremely efficient flexible organic light-emitting diodes with modified graphene anode. Nature Photonics, 6(2), 105-110. https://doi.org/10.1038/nphoton.2011.318.

Hobson, P., Wedge, S., Wasey, J., Sage, I. and Barnes, W. (2002), Surface Plasmon Mediated Emission from Organic Light-Emitting Diodes. Adv. Mater., 14: 1393-1396. https://doi.org/10.1002/1521-4095(20021002)14:19<1393::AID-ADMA1393>3.0.CO;2-B.

J. Jean, A. Wang, and V. Bulovic, In situ vapor-deposited parylene substrates for ultra-thin, lightweight organic solar cells, Org. Electron. Physics, Mater. Appl. 31, 120 (2016). 13 pages.

J.-H. Lee and A. Kim, "Structural and thermal characteristics of the fast-deposited parylene substrate for ultra-thin organic light emitting diodes," Org. Electron. 47, 147-151 (2017).

Jongchan Kim, Yue Qu, Caleb Coburn, and Stephen R. Forrest, Efficient Outcoupling of Organic Light-Emitting Devices Using a Light-Scattering Dielectric Layer, ACS Photonics 2018 5 (8), 3315-3321, DOI: 10.1021/acsphotonics.8b00539.

Jurow MJ, Mayr C, Schmidt TD, Lampe T, Djurovich PI, Brütting W, Thompson ME. Understanding and predicting the orientation of heteroleptic phosphors in organic light-emitting materials. Nat Mater. Jan. 2016;15(1):85-91. doi: 10.1038/nmat4428. Epub Oct. 5, 2015. PMID: 26436340.

Office Action (Notice of Allowance and Fees Due (PTOL-85)) dated Jan. 28, 2022 for U.S. Appl. No. 16/752,553 (pp. 1-9).

Office Action (Notice of Allowance and Fees Due (PTOL-85)) dated Feb. 7, 2022 for U.S. Appl. No. 16/752,553 (pp. 1-4).

Office Action dated Jun. 3, 2021 for U.S. Appl. No. 16/752,553 (pp. 1-18).

Office Action dated Sep. 21, 2021 for U.S. Appl. No. 16/752,553 (pp. 1-13).

Park S, Heo SW, Lee W, Inoue D, Jiang Z, Yu K, Jinno H, Hashizume D, Sekino M, Yokoia T, Fukuda K, Tajima K, Someya T. Self-powered ultra-flexible electronics via nano-grating-patterned organic photovoltaics. Nature. Sep. 2018;561(7724):516-521. doi: 10.1038/s41586-018-0536-x. Epub Sep. 26, 2018. PMID: 30258137.

Qu, Y., Slootsky, M. & Forrest, S. Enhanced light extraction from organic light-emitting devices using a sub-anode grid. Nature Photon 9, 758-763 (2015). https://doi.org/10.1038/nphoton.2015.194.

S. Möller and S. R. Forrest, "Improved light out-coupling in organic light emitting diodes employing ordered microlens arrays", Journal of Applied Physics 91 , 3324-3327 (2002) https://doi.org/10.1063/1.1435422.

Sun, Y., Forrest, S. Enhanced light out-coupling of organic light-emitting devices using embedded low-index grids. Nature Photon 2, 483-487 (2008). https://doi.org/10.1038/nphoton.2008.132.

T. Yokota, P. Zalar, M. Kaltenbrunner, H. Jinno, N. Matsuhisa, H. Kitanosako, Y. Tachibana, W. Yukita, M. Koizumi, and T. Someya, Ultraflexible organic photonic skin, Sci. Adv. (2016). 9 pages.

(56) References Cited

OTHER PUBLICATIONS

V. Bulovic, V.B. Khalfin, G. Gu, P.E. Burrows, D.Z. Garbuzov, and S. Forrest, Weak microcavity effects in organic light-emitting devices, Phys. Rev. B. Condens. Matter 58, 3730 (1998). 11 pages.

W. H. Koo, S. M. Jeong, F. Araoka, K. Ishikawa, S. Nishimura, T. Toyooka, and H. Takezoe, "Light extraction from organic light-emitting diodes enhanced by spontaneously formed buckles," Nat. Photonics 4(4), 222-226 (2010).

Wang, R., Xu, L.-H., Li, Y.-Q., Zhou, L., Li, C., Ou, Q.-D., Chen, J.-D., Shen, S. and Tang, J.-X. (2015), Broadband Light Out-Coupling Enhancement of Flexible Organic Light-Emitting Diodes Using Biomimetic Quasirandom Nanostructures. Advanced Optical Materials, 3: 203-210. https://doi.org/10.1002/adom.201400391.

Wang, Z., Helander, M., Qiu, J. et al. Unlocking the full potential of organic light-emitting diodes on flexible plastic. Nature Photon 5, 753-757 (2011). https://doi.org/10.1038/nphoton.2011.259.

Xu LH, Ou QD, Li YQ. Zhang YB, Zhao XD, Xiang HY, Chen JD, Zhou L, Lee ST, Tang JX. Microcavity-Free Broadband Light Outcoupling Enhancement in Flexible Organic Light-Emitting Diodes with Nanostructured Transparent Metal-Dielectric Composite Electrodes. ACS Nano. Jan. 26, 2016;10(1):1625-32. doi: 10.1021/acsnano.5b07302. Epub Dec. 23, 2015. PMID: 26687488.

Yue Qu, Caleb Coburn, Dejiu Fan, and Stephen R. Forrest, Elimination of Plasmon Losses and Enhanced Light Extraction of Top-Emitting Organic Light-Emitting Devices Using a Reflective Subeleotrode Grid, ACS Photonics 2017 4 (2), 363-368, DOI: 10.1021/acsphotonics.6b00847.

Yue Qu, Jongchan Kim, Caleb Coburn, and Stephen R. Forrest, Efficient, Nonintrusive Outcoupling in Organic Light Emitting Devices Using Embedded Microlens Arrays, ACS Photonics 2018 5 (6), 2453-2458 DOI: 10.1021/acsphotonics.8b00255.

Zhou L, Xiang HY, Shen S, Li YQ. Chen JD, Xie HJ, Goldthorpe IA, Chen LS, Lee ST, Tang JX. High-performance flexible organic light-emitting diodes using embedded silver network transparent electrodes. ACS Nano. Dec. 23, 2014;8(12):12796-805. doi: 10.1021/nn506034g. Epub Dec. 5, 2014. PMID: 25470615.

* cited by examiner

FLEXIBLE ELECTRONIC DISPLAY DEVICE

CROSS-REFERENCE TO RELATED APPLICATIONS

This application is a continuation of U.S. patent application Ser. No. 16/752,553, filed Jan. 24, 2020, which claims priority to U.S. Provisional Patent Application No. 62/797,018 filed on Jan. 25, 2019, both of which are incorporated herein by reference in their entirety.

STATEMENT REGARDING FEDERALLY SPONSORED RESEARCH OR DEVELOPMENT

This invention was made with government support under DE-EE0007626 awarded by the U.S. Dept. of Energy. The government has certain rights in the invention.

FIELD OF THE DISCLOSURE

The present disclosure relates to an electronic display device with improved external quantum efficiencies having a flexible substrate with a corrugated surface, and methods of making the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

Flexibility is a key advantage of organic electronics. In particular, flexible organic light-emitting diodes (OLEDs) are currently employed in mobile devices, with interest now turning to foldable displays. However, currently available flexible OLEDs suffer from poor light extraction efficiency. Although phosphorescent OLEDs (PHOLEDs) have realized 100% internal quantum efficiency, the external quantum efficiency ($\eta_{EQE}$) of PHOLEDs on flat glass substrates is limited to ~20% due to total internal reflection, and losses to absorption, waveguide, and surface plasmon polariton (SPP) modes. Numerous methods have been advanced to enhance light outcoupling in other devices, including microlens arrays and roughened substrates for extracting substrate modes; sub-anode grids and Bragg diffraction gratings for waveguided modes; and corrugated cathodes or metal-free structures in the active region for surface plasmon polariton (SPP) modes.

SUMMARY OF THE DISCLOSURE

In one aspect, a method of fabricating a light emitting device comprises providing a mold having an unpolished surface with an arithmetic mean roughness $R_a$ in a range from 0.1 μm to 10 μm, depositing a thin polymer film over the surface of the mold, wherein the film has a thickness in a range from 1 μm to 100 μm, positioning a light emitting body onto the thin polymer film, wherein the light emitting body includes an anode, a cathode, and a light emitting layer positioned between the anode and the cathode, and separating the thin polymer film with the light emitting body from the mold.

In one embodiment, the method further comprises depositing a release agent on the mold to form a release layer before depositing the thin polymer film over the surface of the mold. In one embodiment, the release agent is deposited via spin coating. In one embodiment, the mold comprises a metal oxide. In one embodiment, the arithmetic mean roughness $R_a$ is in a range from 0.25 μm to 1.35 μm. In one embodiment, the thin polymer film thickness is in a range from 2 μm to 25 μm. In one embodiment, the thin polymer film thickness is in a range from 5 μm to 15 μm. In one embodiment, the method further comprises positioning a frame having an opening over the mold before depositing the thin polymer film.

In one embodiment, the method further comprises positioning multiple frames forming a geometric pattern with a plurality of substantially equivalent openings. In one embodiment, the thin polymer film comprises parylene. In one embodiment, the thin polymer film has a refractive index in a range from 1.6 to 1.8. In one embodiment, the light emitting layer includes a phosphorescent emitter compound doped into a host material, wherein the phosphorescent emitter compound has a peak light emission wavelength in a range from 490 nm to 650 nm.

In one embodiment, the light emitting layer includes a fluorescent emitter or a thermal-assisted delayed fluorescent emitter. In one embodiment, the electronic light display is a white-light organic electroluminescent device. In one embodiment, the light emitting body includes separate red and green light emitting elements. In one embodiment, the method further comprises depositing a second thin polymer film over an exposed surface of the light emitting body opposite a second surface of the light emitting body facing the mold, after the light emitting body has been positioned over the mold.

In one embodiment, the method comprises forming the separated parylene-based film with the light emitting body into a roll, and providing the roll to a roll-to-roll manufacturing process.

In another aspect, a light emitting device comprises a thin polymer substrate having a thickness in a range from 2 μm to 25 μm, and having an external surface and an opposite internal surface, wherein the external surface has an arithmetic mean roughness $R_a$ in a range from 0.1 μm to 10 μm, and a light emitting body disposed over the internal surface of the thin polymer substrate, the light emitting body comprising an anode, a cathode and at least one light emitting layer positioned between the anode and the cathode.

In one embodiment, the device further comprises a second thin polymer layer disposed over the light emitting body, opposite the thin polymer substrate. In one embodiment, the thin polymer substrate comprises parylene. In one embodiment, the external surface has a random corrugation pattern. In one embodiment, the arithmetic mean roughness $R_a$ is in a range from 0.40 μm to 1.0 μm. In one embodiment, the thin polymer substrate has a thickness in a range from 5 μm to 15 μm. In one embodiment, the thin polymer substrate has a refractive index of between 1.5 and 1.8. In one embodiment, the refractive index is between 1.6 and 1.7. In one embodiment, the refractive index is about 1.64.

In one embodiment, the at least one light emitting layer includes a phosphorescent emitter compound doped into a host material, wherein the phosphorescent emitter compound has a peak light emission wavelength in a range from 490 nm to 650 nm. In one embodiment, the light emitting layer includes a fluorescent emitter or a thermal-assisted delayed fluorescent emitter.

In one embodiment, the light emitting body is a white-light organic electroluminescent device. In one embodiment, the light emitting body includes separate red and green light emitting elements. In one embodiment, the anode comprises ITO and has a thickness of between 50 nm and 200 nm.

In another aspect, a consumer product includes a light emitting device according to the disclosure, wherein the consumer product is selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

BRIEF DESCRIPTION OF THE DRAWINGS

The foregoing purposes and features, as well as other purposes and features, will become apparent with reference to the description and accompanying figures below, which are included to provide an understanding of the disclosure and constitute a part of the specification, in which like numerals represent like elements, and in which.

DETAILED DESCRIPTION

Figure 1:
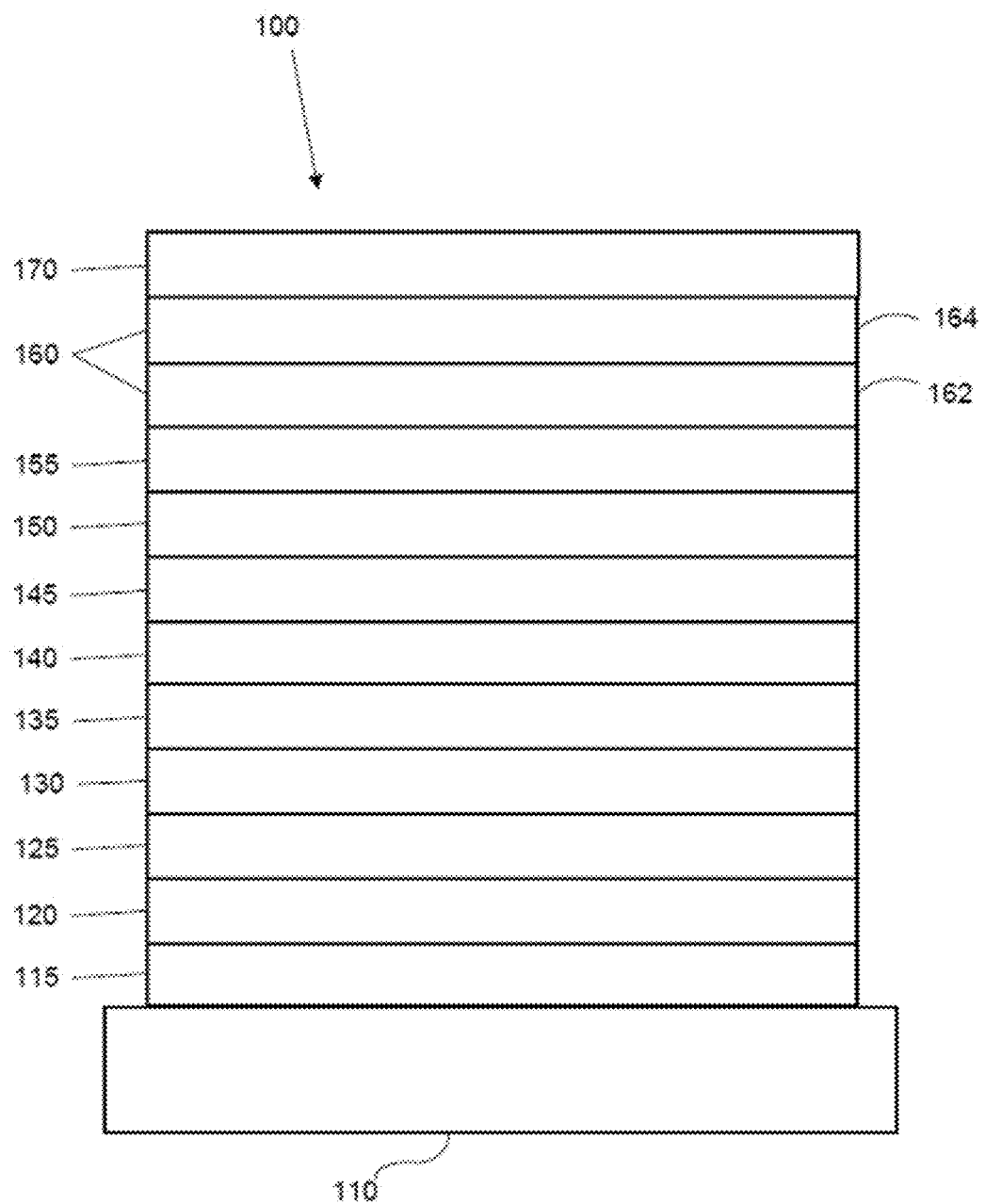
FIG. 1 shows an organic light emitting device.

It is to be understood that the figures and descriptions of the present disclosure have been simplified to illustrate elements that are relevant for a clear understanding of the present disclosure, while eliminating, for the purpose of clarity, many other elements found in related systems and methods. Those of ordinary skill in the art may recognize that other elements and/or steps are desirable and/or required in implementing the present disclosure. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this disclosure belongs. Although any methods and materials similar or equivalent to those described herein can be used in the practice or testing of the present disclosure, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects of the disclosure can be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
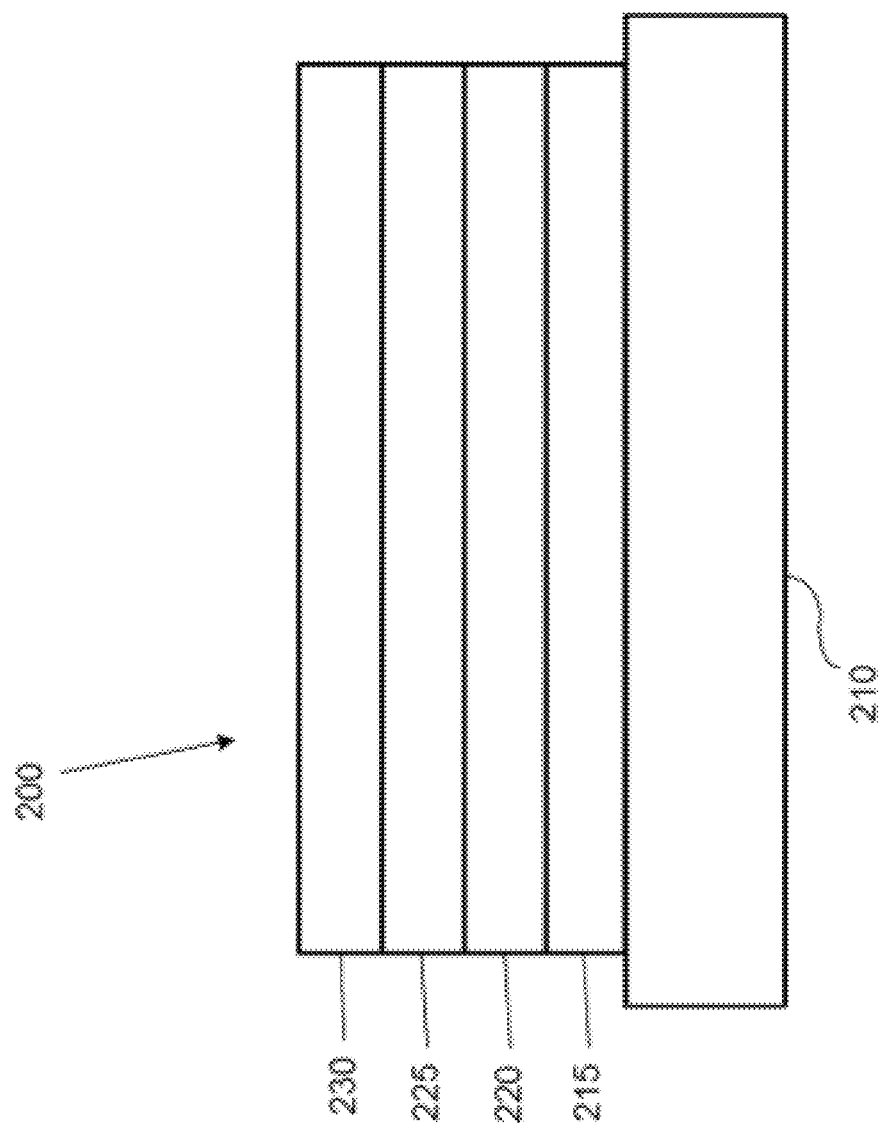
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIG. 1 and FIG. 2 is provided by way of non-limiting example, and it is understood that embodiments of the disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIG. 1 and FIG. 2.

Some aspects of the disclosure relate to polychloro-p-xylylene, referred to herein as parylene. Parylene as contemplated herein may form transparent, conformal, pinhole-free and strain-free sheets with good dielectric and mechanical properties that may be utilized as flexible substrates for polymer light-emitting diodes (PLEDs), organic photovoltaics (OPVs) and OLEDs.

Although certain embodiments of the disclosure are discussed in relation to one particular device or type of device (for example OLEDs) it is understood that the disclosed improvements to light outcoupling properties of a substrate may be equally applied to other devices, including but not limited to PLEDs, OPVs, charge-coupled devices (CCDs), photosensors, or the like.

Disclosed herein are high-efficiency, flexible light emitting devices for applications including, but not limited to, display and lighting. The disclosed flexible light emitting devices show a Lambertian intensity profile whose spectra are unchanged at different viewing angles. The very thin and flexible substrates offer a solution for foldable displays over very small radii for use in mobile devices and medical applications. Also disclosed herein are methods of making high-efficiency flexible light emitting devices as described.

In various embodiments, the flexible OLED will comprise a substrate that may be corrugated, thin (having a thickness in some embodiments of between 0.5 and 50 μm), lightweight (10 to 20 g/m$^2$), and flexible. The substrate may in some embodiments comprise polychloro-p-xylylene (parylene) or a parylene-based compound. In some embodiments, a pattern may be imprinted on one or both surfaces of the substrate, for example a corrugation pattern. Such a pattern may have features of a size on the scale of electromagnetic wavelengths, for example features having a size between 200 nm and 1500 nm, or between 300 nm and 1000 nm, or between 400 nm 750 nm. In some embodiments, the features in the pattern are random or semi-random. The patterned surface or surfaces may efficiently outcouple trapped substrate, waveguide and surface plasmon modes. In one embodiment, a red or green phosphorescent OLED is fabricated on a corrugated parylene substrate (CP-OLED), having an observable improvement in external quantum efficiency. In some embodiments, a green CP-OLED has an external quantum efficiency of 28±2%, compared with 21±1% for a comparable green OLED with a flat glass substrate.

Figure 3A:
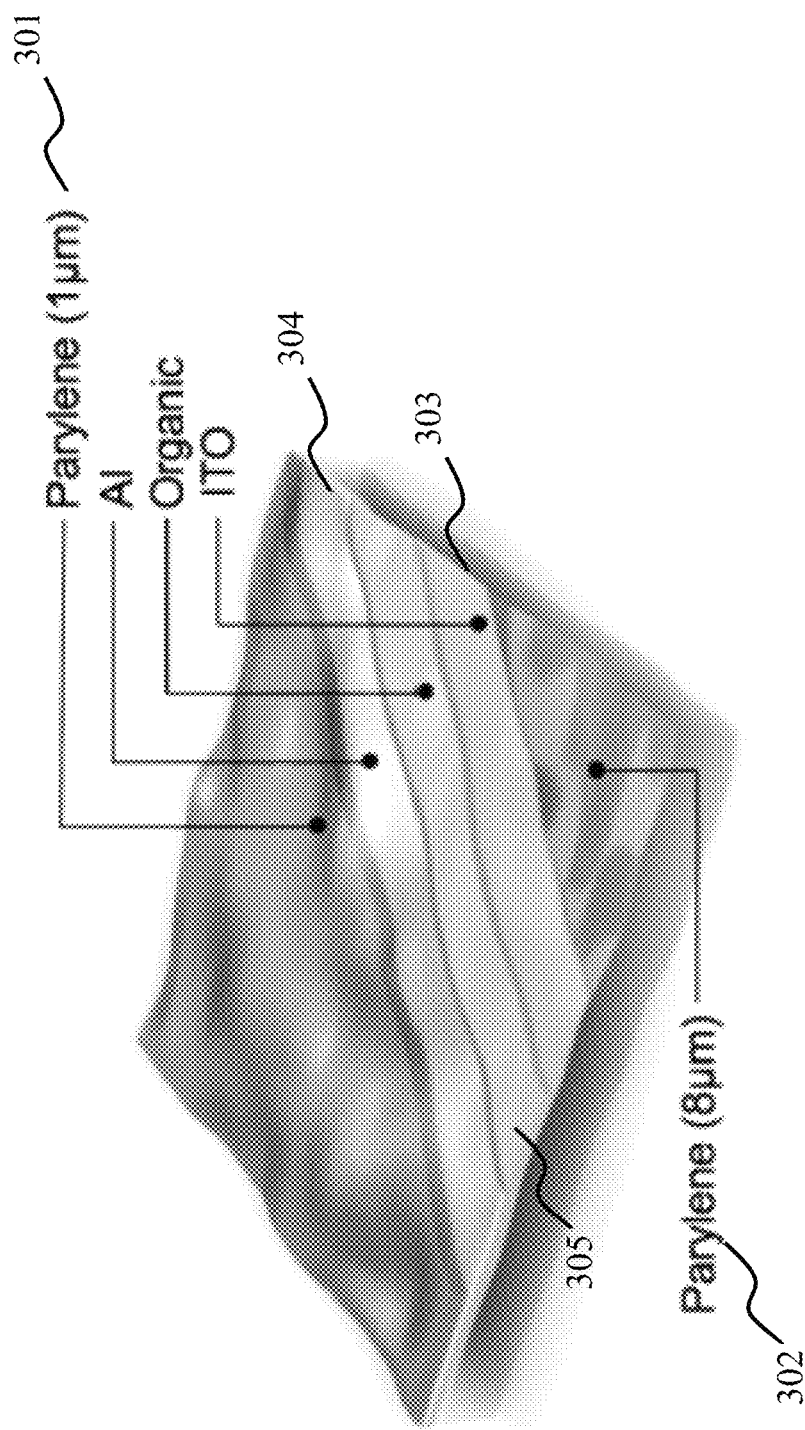
FIG. 3A is a schematic representation of a flexible OLED of the disclosure.

With reference to FIG. 3A, in some embodiments, the flexible light emitting device comprises a parylene-based substrate 302 with an external surface and an opposite internal surface, wherein the external surface has a random corrugated surface with an arithmetic mean roughness sub-Ra, e.g., a sub-Ra is in a range from 0.40 μm to 1.0 μm, which is about 8% to 20% less than an arithmetic mean roughness Ra of a surface of a metal oxide mold from which the external surface of the parylene-based substrate is formed, and the parylene-based substrate has a thickness in a range from 0.5 μm to 100 μm or 1 μm to 50 μm or 2 μm to 25 μm, or 5 μm to 15 μm, and disposed atop the substrate is a light emitting body, wherein the light emitting body includes an anode (in the depicted embodiment, ITO anode 303), a cathode (in the depicted embodiment, aluminum cathode 304), and a light emitting layer (in the depicted embodiment, organic light emitting layer 305) positioned between the anode 303 and the cathode 304. In some embodiments, the flexible light emitting device further includes a second thin polymer layer 301, which may also comprise parylene or a parylene based layer.

In one embodiment, the light emitting layer includes a stack of light emitting sublayers. In another embodiment, the light emitting layer includes light emitting sublayers that are arranged in a horizontally adjacent pattern, e.g., to from adjacent sub-pixels or an electronic display. For example, the light emitting body can includes separate red and green light emitting sublayers in a stacked or side-by-side (i.e., adjacent) arrangement.

The emitting layer can include one or more phosphorescent emitter compounds doped into a host material, wherein the phosphorescent emitter compound has a peak light emission wavelength in a range from 470 nm to 650 nm. In some instances, the light emitting layer can also include a fluorescent emitter compound or a thermal-assisted delayed fluorescent (TADF) emitter compound. For example, the emitting layer can include fluorescent or TADF compound with a peak light emission wavelength in a range from 430 nm to 500 nm.

In one embodiment, the electronic light display is a white-light organic electroluminescent device (WOLED).

In one embodiment, the parylene-based film has a refractive index in a range from 1.5 to 1.8, or 1.6 to 1.8, or 1.6 to 1.7. In one exemplary embodiment, a parylene substrate with a refractive index of n=1.64 is used, which is preferable in terms of outcoupling compared to the commonly used flexible polyethylene terephthalate (PET) substrates whose refractive index is n=1.57. A visible-wavelength-scale random corrugation imprinted on both surfaces of the parylene sheet, as shown in FIG. 3A, scatters light from substrate, waveguide and SPP modes. Corrugated parylene OLEDs increase the external quantum efficiency at a current density of J=0.1 mA/cm$^2$ to $\eta_{EQE}$=28±2%, from $\eta_{EQE}$=21±1% for analogous OLEDs on flat glass substrates. The thin film OLEDs show a Lambertian intensity profile with identical spectra independent of viewing angle.

Figure 3B:
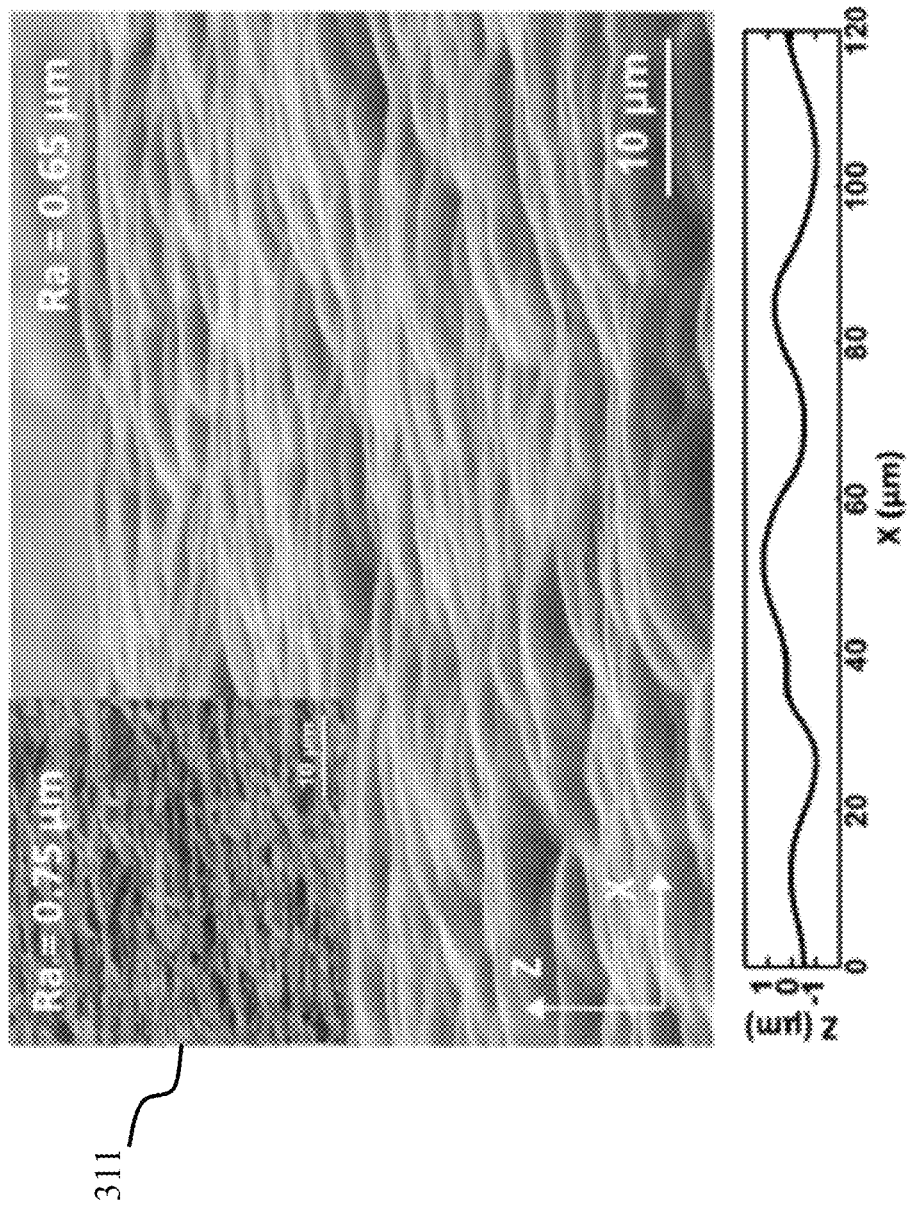
FIG. 3B is a scanning electron microscope (SEM) image an Al cathode of an OLED of the disclosure, which demonstrates the random corrugation of the substrate carries through the OLED body.

The imprinted corrugated pattern of the CP-OLED randomizes the emitted light trajectories, allowing more of the trapped photons to find the escape cone at all interfaces. The result of this randomization is a Lambertian profile and wavelength-independent emission characteristics. In particular, the corrugated pattern with a visible-wavelength-scale surface roughness of $R_a$=0.65 μm effectively enhances the outcoupling of photons within the visible spectrum. Correspondingly, as shown in the inset of FIG. 3B, the surface profile of the CP-OLED has an approximately 20 μm lateral distance from peak to valley. This structure ensures that the waveguide modes can be effectively scattered out before absorption. The outcoupling efficiencies of CP-OLEDs can be further optimized by using surface molds with optimized roughness, such as sandblasted glass. Compared to other outcoupling schemes implemented in PET-based flexible OLEDs, such as adopting a high-index electrode or introducing gratings/corrugations using nanoimprint lithography, (both of which require complicated fabrication processes), the disclosed method is simpler and has a potentially lower cost.

Devices of the present disclosure may comprise one or more electrodes, some of which may be fully or partially transparent or translucent. In some embodiments, one or more electrodes comprise indium tin oxide (ITO) or other transparent conductive materials. In some embodiments, one or more electrodes may comprise flexible transparent and/or conductive polymers.

Methods

In some embodiments, the present disclosure includes methods of fabricating a flexible display device of the present disclosure.

In some embodiments, a method of making a flexible display device includes the step of providing or preparing a mold for producing the one or more parylene surfaces. The mold may in some embodiments be an unpolished sapphire wafer, sandblasted glass, a metal oxide, or any other suitable material, meaning one that is not attacked by processes that are used in deposition or removal of the substrate material. The mold may have an arithmetic mean roughness $R_a$ in a range from 0.1 μm to 10 μm, or 0.2 μm to 5 μm, or 0.25 μm to 1.35 μm.

In some instances, the surface of the unpolished metal oxide is provided with a coating of a release agent to form a release layer to further facilitate separation and minimize damage to the one deposited surface of the parylene substrate. As understood in the art in view of the present disclosure, a release agent is any material used to prevent a molded material from bonding to the mold surface, facilitating separation of the molded material from the molded surface once the molded material dries, cures, or otherwise becomes ready for separation from the mold. In some embodiments, the release layer comprises a detergent, for example 2% micro-90 detergent. The release layer may be deposited using any suitable method, for example spin-coating.

Figure 3C:
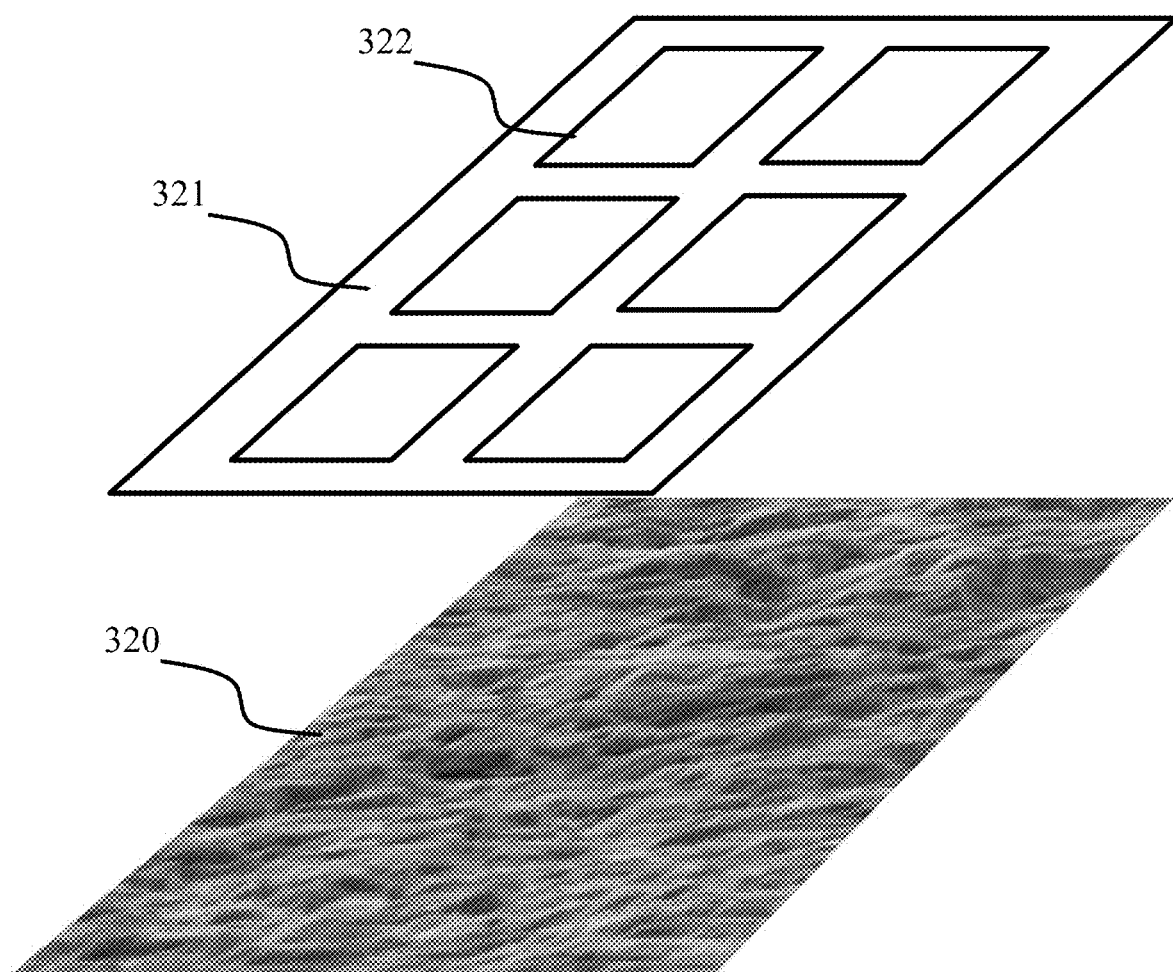
FIG. 3C shows an exemplary frame for use in depositing a film onto a mold.

With reference to FIG. 3C, in some embodiments, to facilitate separating the parylene substrate from the surface of the metal oxide it can be advantageous to position a frame 321 onto the surface of the metal oxide mold 320 or on the release layer. The frame 321 may in some embodiments include a geometric pattern of frame elements 322 that define one or a plurality of substantially equivalent cavities into which the parylene-based film is deposited onto the unpolished surface of the metal oxide 320. For example, the frame elements 322 can be arranged in the form of a rectangular or rhombic grid.

In some embodiments, the frame comprises an adhesive material, for example a gel, Teflon tape, or other suitable material. The frame may be thin, having a thickness in a range of 0.1 mm to 1 mm, or 0.12 mm to 0.5 mm, or 0.15 mm to 0.2 mm. In one embodiment one or more of the frames may comprise PF film X4. Suitable frames may comprise multiple layers, for example a clear substrate layer and a gel layer.

A thin polymer film, for example parylene, is then deposited over the mold. The thickness of the polymer film may in some embodiments be several microns, as described elsewhere herein.

A method of the disclosure may then include the step of depositing various light emitting device or OLED layers over the thin polymer film to form an OLED body. Layers may include one or more electrodes, organic emissive layers, electron- or hole-blocking layers, electron- or hole-transport layers, buffer layers, or any other suitable layers known in the art. In some embodiments, one or more of the electrode layers may comprise a transparent flexible material. In some embodiments, both electrodes may comprise a flexible material and one electrode may comprise a transparent flexible material.

Upon completion of the fabrication of the OLED body and an optional barrier layer, the parylene-based film with the light emitting body is separated from the metal oxide surface and formed into a roll. The roll is then used in a roll-to-roll manufacturing process.

A variety of parylene precursor materials can be used. As generally known in the art, parylene includes a variety of a number of unsubstituted and substituted poly(para-xylylene). Exemplary parylenes include parylene A (amino-modified parylene), parylene C (poly(chloro-p-xylylene)), parylene N (poly(p-xylylene)), parylene D (poly(dichloro-p-xylylene)), parylene F (which can specifically refer to parylene-VT4, parylene-AF4, or any other parylene with a fluorine atom or atoms in the molecular structure), as well as mixtures and derivatives thereof.

In one embodiment, the formation of the parylene-based substrate atop the metal oxide can be accomplished under very favorable manufacturing environments. One such method of depositing the parylene film comprises introducing a first precursor into a first region of a processing chamber that is maintained at a temperature of about 200° C. or less. Exemplary first precursors are selected from the group consisting of [2.2]paracyclophane, dichloro[2.2]-paracyclophane, tetrachloro[2.2]paracyclophane, 4,12-dibromo[2.2]paracyclophane, and octafluoro[2.2]paracyclophane. The first precursor is exposed to ultraviolet radiation in the first region where the photolysis of the first precursor provides a second precursor that includes p-xylylene. The second precursor is directed to a second region of the processing chamber, which is separated from the first region by a showerhead. Eventually, the second precursor is directed to a deposition chamber where it contacts the unpolished surface of the metal oxide to form the parylene-based substrate film on the metal oxide, which can be maintained at a temperature of less than about 100° C. during the deposition (film formation). See, U.S. Pub No. 2016/0096193.

To further simplify manufacturing of flexible OLEDs a second parylene-based layer formed using known parylene precursors such as of parylene-C, parylene-N, or other parylene materials can be used a barrier layer and deposited near ambient temperature. The parylene layer provides: (1) a diffusion barrier against corrosive species, (2) encapsulation of macroscopic particles on the substrate, and (3) strain relaxation. One such parylene diffusion barrier for electronic display devices is describe in U.S. Pub. No. 2016/0181569, the entire disclosure of which is incorporated herein by reference. The parylene barrier film can provide a moderate level of moisture diffusion inhibition, e.g., approximately in the range of 1-100 grams of $H_2O$ per square meter of barrier area per day. A combined parylene-metal oxide barrier layer as described in U.S. Pub. Nos. 2017/0159178; 20170133292, can also be used.

Figure 4:
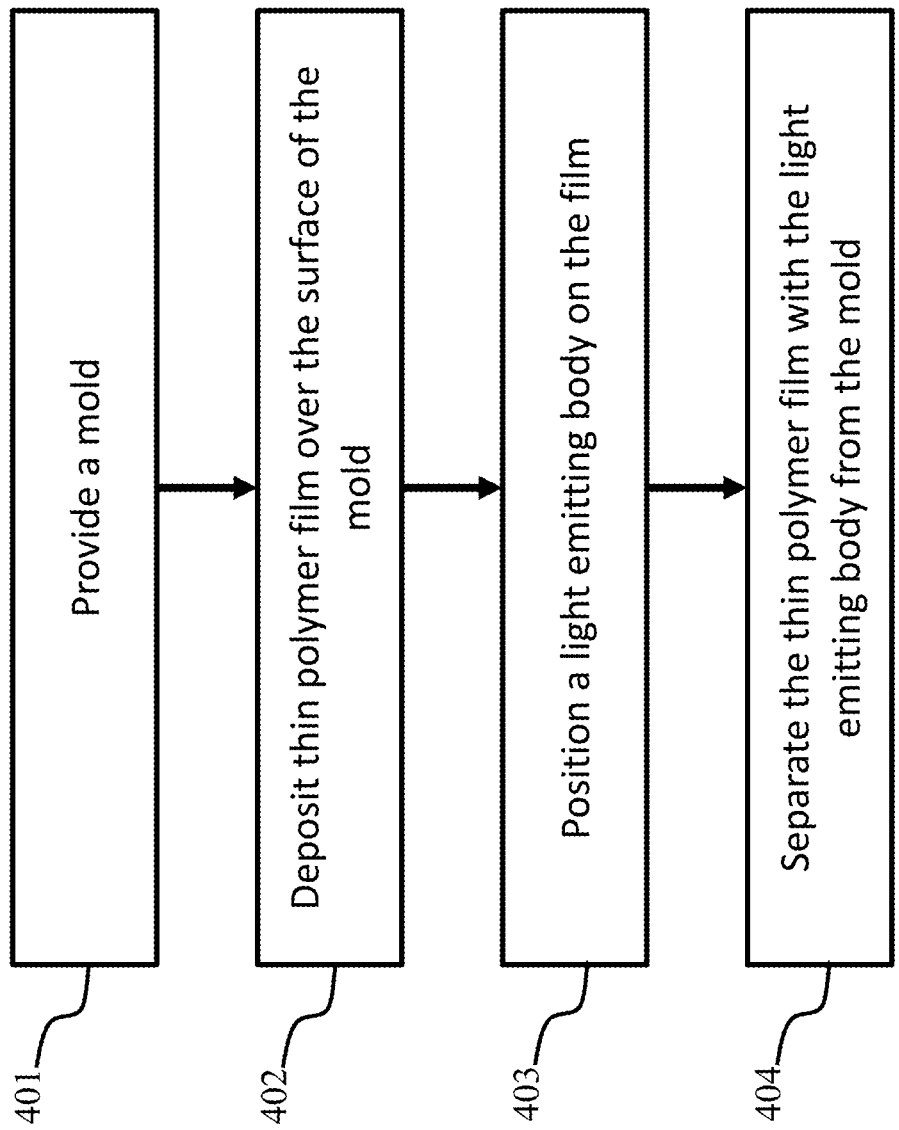
FIG. 4 is a method of the disclosure.

With reference to FIG. 4, a method of fabricating a light emitting device of the present disclosure is shown. The method includes the steps of providing a mold having an unpolished surface with an arithmetic mean roughness $R_a$ in a range from 0.1 µm to 10 µm in step 401, depositing a thin polymer film over the surface of the mold, wherein the film has a thickness in a range from 1 µm to 100 µm in step 402, positioning a light emitting body onto the thin polymer film, wherein the light emitting body includes an anode, a cathode, and a light emitting layer positioned between the anode and the cathode in step 403, and separating the thin polymer film with the light emitting body from the mold in step 404.

Figure 5A:
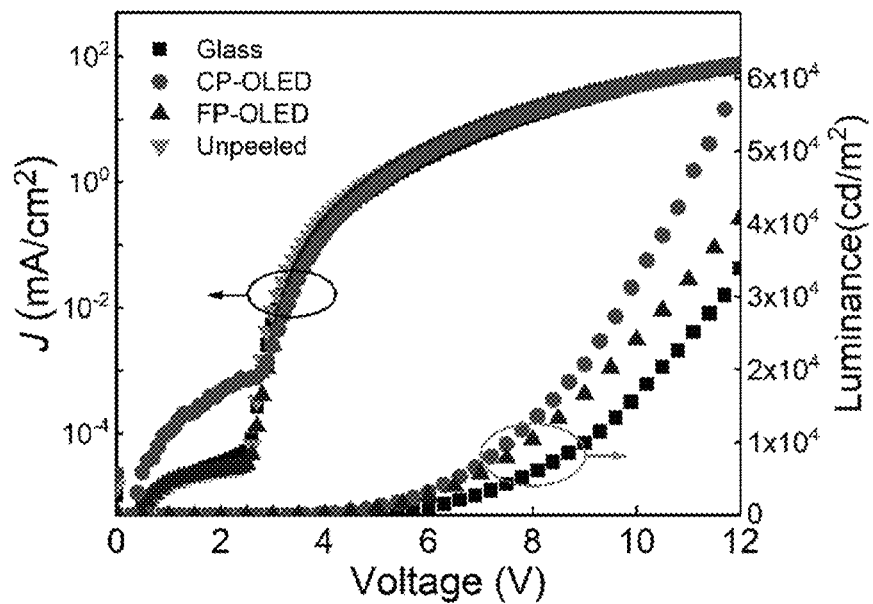
FIG. 5A shows the J-V characteristics of a green OLED of the disclosure and a comparable green OLED with relatively smooth (flat) glass substrate.

FIG. 5A shows the J-V-L characteristics of the CP/FP (flat parylene)-OLEDs and devices on glass substrates. The CP/FP-OLEDs demonstrate nearly identical electrical properties, e.g., nearly identical J-V characteristics, compared with both the unpeeled and glass substrate devices. The FP-OLED has $\eta_{EQE}=24\pm2\%$ at $J=0.1$ mA/cm², compared to $\eta_{EQE}=21\pm1\%$ for the device on the glass substrate. In the CP-OLED, $\eta_{EQE}=28\pm2\%$ (see FIG. 5B). The corrugated features of the device have no impact on the electrical properties of the OLED itself since the micron-scale smoothness of the corrugations do not significantly affect the uniformity of the nanometer-scale thicknesses of the OLED active layers.

Figure 5B:
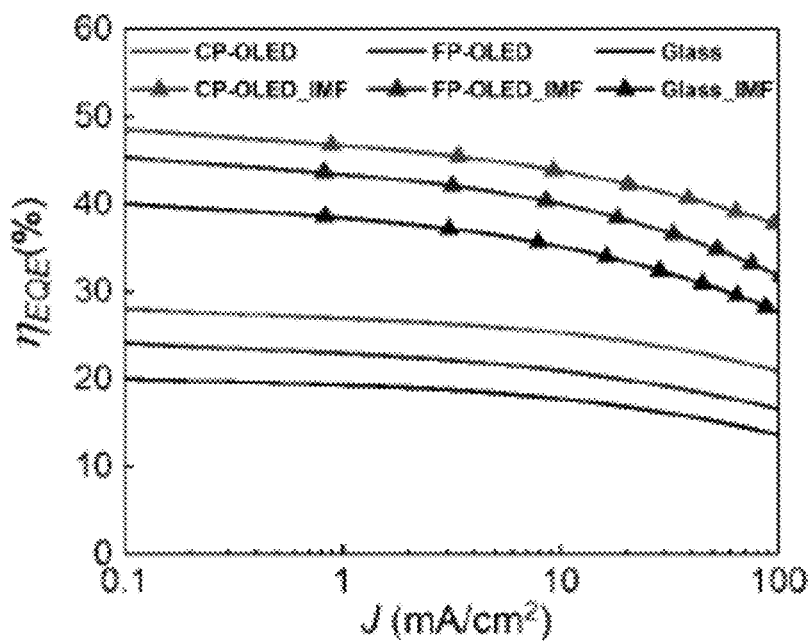
FIG. 5B plots the external quantum efficiencies of inventive OLED to a comparable OLED with glass substrate.

To understand the source of improvement of the CP-OLED outcoupling from waveguide and SPP modes, optical power in all the substrate modes of several devices were measured using IMF, with results compared in FIG. 5B (triangles). The calculations assume unity transmission at the parylene/sapphire interface. The unpeeled CP-OLED yields $\eta_{EQE}=49\pm3\%$, and the unpeeled FP-OLED yields $\eta_{EQE}=46\pm3\%$. Also, $\eta_{EQE}=41\pm3\%$ is obtained for the device on the glass substrate. By subtracting the efficiencies of the glass substrate devices, the enhancement in the extracted waveguided modes is $\Delta\eta_{WV\_CP-OLED}=8\pm6\%$ for the CP-OLED, and $\Delta\eta_{WV\_FP-OLED}=5\pm6\%$ for the FP-OLED.

Figure 6:
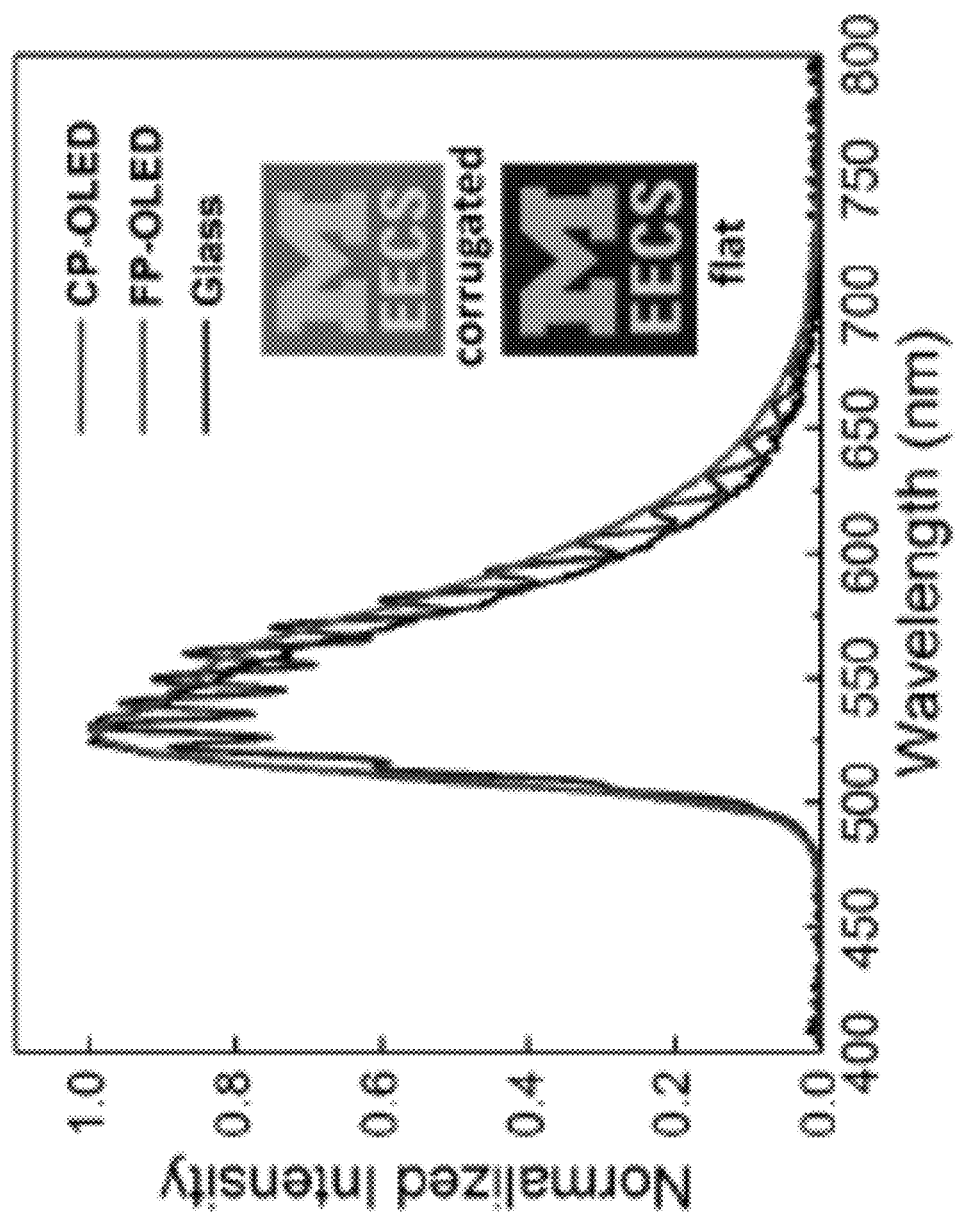
FIG. 6 is an electroluminescence (EL) spectrum of the green OLED of FIG. 5A, and the comparable green OLED.
Figure 7A:
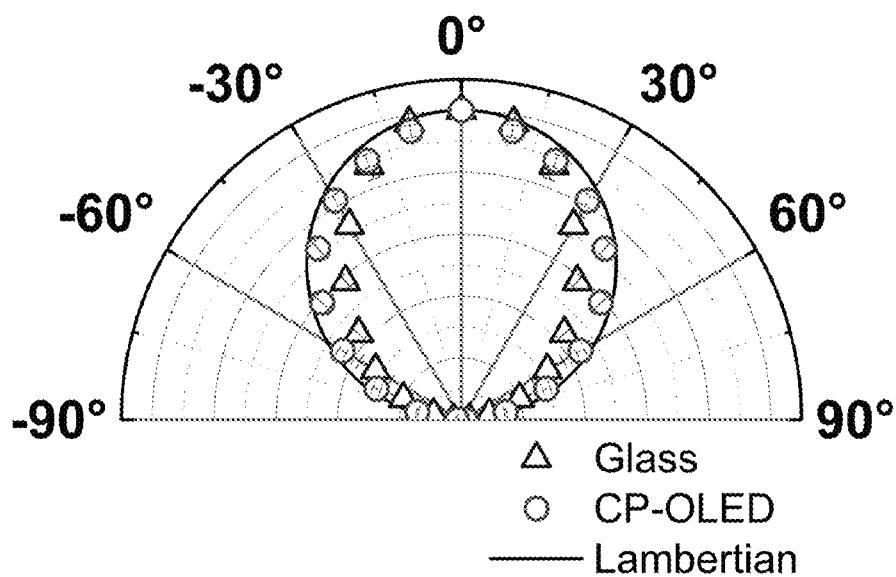
FIG. 7A and FIG. 7B show the angular emission characteristics for the green OLED of the disclosure.
Figure 7B:
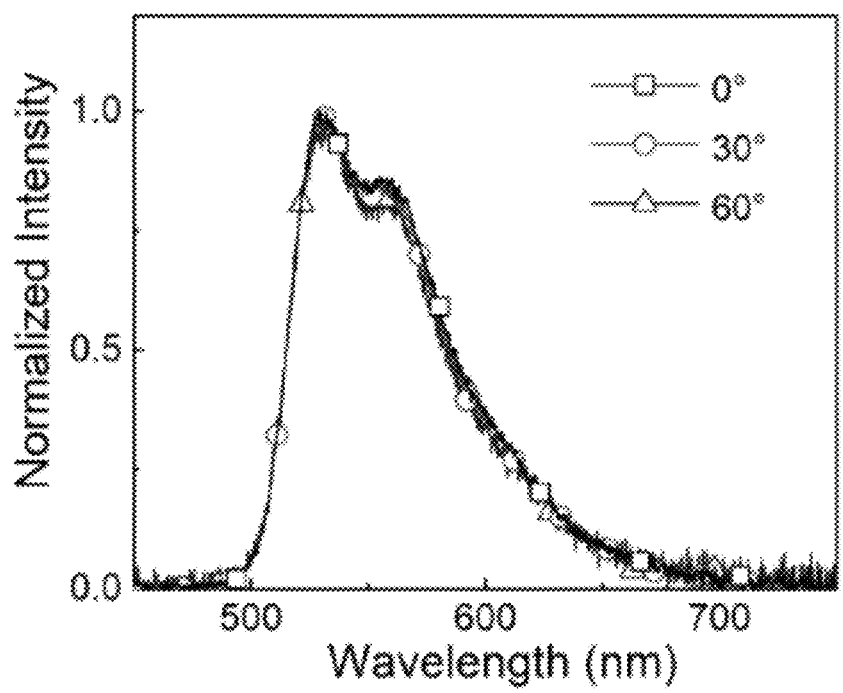

The electroluminescence (EL) spectra of a green OLED of the present disclosure are shown in the FIG. 6. Each OLED has a spectral peak at $\lambda\approx530$ nm. The EL spectrum of the FP-OLED shows small oscillations with a period $\Delta\lambda\approx10$ nm due to interference from the opposite surfaces of the flat, 8 µm thick parylene substrate. This oscillation does not exist for the CP-OLED due to randomization of the optical field by the corrugations. The spectra of parylene-based devices are slightly broader than those using conventional glass substrates due to weaker cavity effects, because the refractive index difference between parylene and the organic layers is small. Photographs of exemplary corrugated (upper) and flat (lower) parylene substrates on a printed image are shown in the inset of FIG. 6. The flat parylene substrate is transparent while the corrugated one appears hazy due to the random scattering from its roughened surface. The angular emission characteristics for the CP-OLED are shown in FIG. 7A and FIG. 7B. The CP-OLED shows a Lambertian intensity profile. Similarly, the spectral shapes are independent of viewing angle to at least 60° from the substrate normal.

Figure 8A:
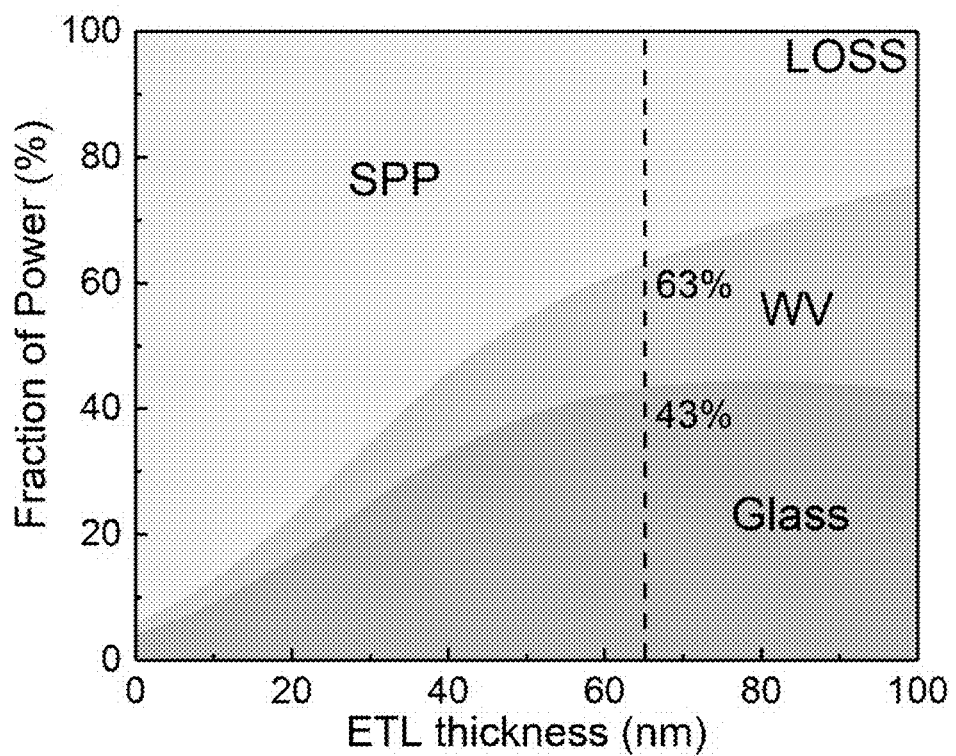
FIGS. 8A and 8B show the calculated optical power distributions for OLEDs with comparative glass substrate and parylene substrate of an inventive OLED.
Figure 8B:
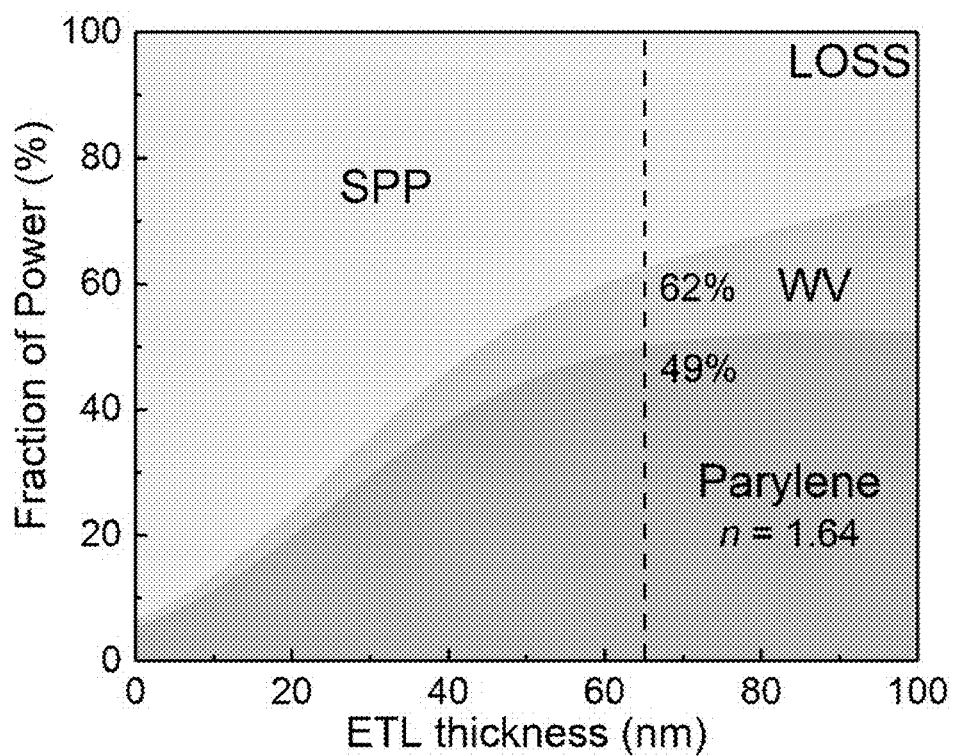

The calculated optical power distributions for the glass and parylene substrate devices are shown in FIG. 8A and FIG. 8B. At an ETL thickness of 65 nm, the high refractive index of the parylene substrate extracts waveguide modes from the organic and anode layers, resulting in more optical power trapped inside the substrates compared to glass. By subtracting the calculated power of the substrate modes of the glass from the parylene device, the simulated enhancement in the extracted waveguided modes, $\Delta\eta_{WV\_SIM}=6\%$, is consistent with the measurements in FIG. 5B, i.e., $\Delta\eta_{WV\_FP-OLED}=5\pm6\%$.

The described work demonstrates that the use of ultrathin, lightweight and flexible parylene substrates provides a simple and potentially low-cost platform for high-efficiency flexible OLEDs. Outcoupling enhancement is achieved by visible-wavelength-scale corrugations imprinted on the ultrathin high-index parylene substrate. Flexible green PHOLEDs fabricated on corrugated parylene substrates with $\eta_{EQE}=28\pm2\%$ were demonstrated with a Lambertian intensity profile and wavelength-independent emission characteristics. Since the extreme substrate thinness can make handling difficult, in many applications the flexible parylene-based OLEDs can be laminated onto a variety of curved or flat surfaces whose materials choice is unconstrained by device processing conditions. Alternatively, beyond the obvious applications to foldable displays, the thin substrates may serve in medical applications, wearable electronics, or electronic paper where the extreme flexibility is beneficial. Finally, the devices may be compatible with roll-to-roll manufacturing processes, paving the way for widespread and low-cost use of flexible OLEDs in emerging display and lighting applications.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIG. 1 and FIG. 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

In general, the various layers of OLEDs and similar devices described herein may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Some OLED structures and similar devices may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, a light therapy device, and a sign. Various control mechanisms may be used to control devices fabricated in accordance with the present disclosure, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials, structures, and techniques described herein may have applications in devices other than the fabrication of OLEDs. For example, other optoelectronic devices such as organic solar cells and organic photodetectors may employ the materials and structures. More generally, organic devices, such as organic transistors, may employ the materials and structures.

An OLED fabricated using devices and techniques disclosed herein may have one or more characteristics selected from the group consisting of being flexible, being rollable, being foldable, being stretchable, and being curved, and may be transparent or semi-transparent. In some embodiments, the OLED further comprises a layer comprising carbon nanotubes.

In some embodiments, an OLED fabricated using devices and techniques disclosed herein further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

An OLED fabricated according to techniques and devices disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL

A hole injecting/transporting material to be used in the present disclosure is not particularly limited, and any compound may be used as long as the compound is typically used as a hole injecting/transporting material.

EBL

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host

The light emitting layer of the organic EL device of the present disclosure preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

As previously disclosed, OLEDs and other similar devices may be fabricated using a variety of techniques and devices. For example, in OVJP and similar techniques, one or more jets of material is directed at a substrate to form the various layers of the OLED.

EXPERIMENTAL EXAMPLES

The disclosure is further described in detail by reference to the following experimental examples. These examples are provided for purposes of illustration only, and are not intended to be limiting unless otherwise specified. Thus, the disclosure should in no way be construed as being limited to the following examples, but rather, should be construed to encompass any and all variations which become evident as a result of the teaching provided herein.

Without further description, it is believed that one of ordinary skill in the art can, using the preceding description and the following illustrative examples, make and utilize the system and method of the present disclosure. The following working examples therefore, specifically point out the exemplary embodiments of the present disclosure, and are not to be construed as limiting in any way the remainder of the disclosure.

Device Fabrication

Figure 9:
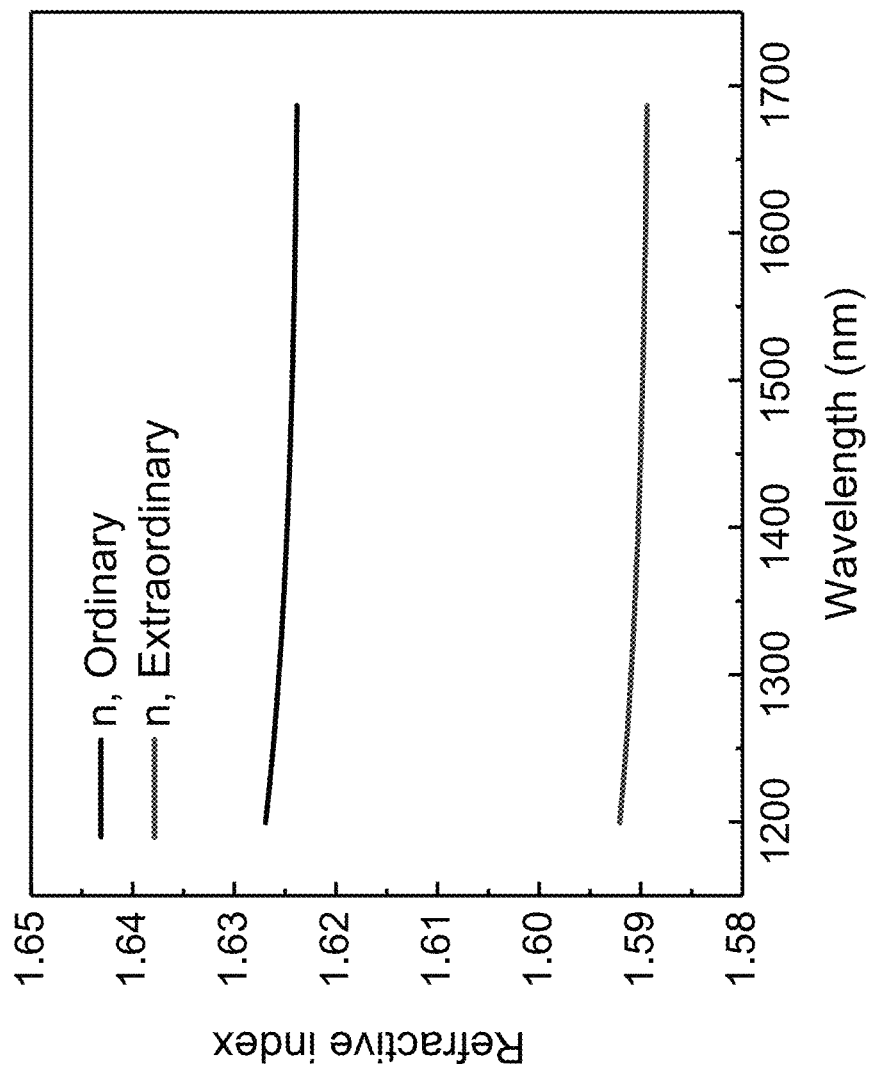
FIG. 9 shows a graph of refractive indices across a range of wavelengths.

The thin film substrate was fabricated by depositing a parylene film on the unpolished side of a sapphire plate. The arithmetic mean roughness of the plate was $R_a$=0.75 μm, as shown in FIG. 3B, inset 311. A float-zone glass plate was used to produce a flat parylene substrate for comparison. A solution of 2 vol % Micro-90 detergent in deionized water was spin-coated onto the plates at 500 rpm for 30 s to form a release layer. A double-sided adhesive gel film (PF film X4, Gel-Pak) was cut into an open rectangle and placed onto the plate surfaces. This frame was used as a fixture for peeling off and handling the free-standing parylene films. An 8 μm thick parylene film was deposited through physical vapor deposition (PVD) process at a base pressure of 18 mTorr. Parylene-C dimer (dichloro-[2,2]paracyclophane) was sublimed at 180° C. and cleaved in a pyrolysis furnace at 690° C. into monomeric form. The monomeric gas was then sent into the deposition chamber where it condensed on the plate surfaces to form a conformal coating at room temperature. The parylene film showed negative birefringence of Δn=−0.04 (see FIG. 9). The graph in FIG. 9 shows the ordinary and extraordinary refractive indices of an 8 μm thick parylene film.

A 70 nm thick ITO layer was sputtered onto the parylene surface, followed by thermal evaporation of the organic layers in vacuum at a base pressure of $10^{-7}$ Torr. The structure of the green bottom-emitting PHOLEDs was: 2 nm MoO$_3$/40 nm 4,4'-cyclohexylidenebis[N,N-bis(4-methylphenyl)benzenamine] (TAPC)/25 nm bis[2-(2-pyridinyl-N)phenyl-C](acetylacetonato)iridium(III) (Ir(ppy)$_2$(acac)) doped at 8 vol % in 4,4'-bis(carbazol-9-yl)biphenyl (CBP)/65 nm 2,2',2"-(1,3,5-benzinetriyl)-tris(1-phenyl-1-H-benzimidazole) (TPBi)/1.5 nm 8-quinolinolato lithium (Liq)/100 nm Al. The devices were patterned using a shadow mask comprising an array of 1 mm wide strips, resulting in a crossbar pattern between the bottom ITO and top Al contacts. The devices were encapsulated by depositing a 1 μm thick parylene film over their surfaces. The parylene thickness is calibrated using a profilometer (Dektak XT). The optical constants and thicknesses of other materials were measured using variable-angle spectroscopic ellipsometry.

The flexible OLEDs were peeled off from the plates using the gel frames and compared to their respective unpeeled samples.

Device Measurements

The current density-voltage (J-V) characteristics of the devices were collected using a semiconductor parameter analyzer (HP-4156A) and a calibrated Si photodiode (Hamamastu, S3584-08). The electroluminescence (EL) spectra were measured using a spectrometer (USB4000, Ocean Optics, Inc). The $\eta_{EQE}$ was calculated using standard methods. See, S. R. Forrest, et al., Adv. Mater. 2003, 15, 1043. Index-matching fluid (IMF) with an index of refraction of $\eta_{IMF,high}$=1.70 was applied between the sapphire substrate (unpeeled sample) and the Si photodiode to detect all air and substrate modes. An IMF with $\eta_{IMF,low}$=1.51 was used for the device on glass.

The optical power distributions within the glass and parylene OLEDs were calculated using Green's function analysis assuming that a dipole emitting at a wavelength of 540 nm was located in the center of the 25 nm thick emissive layer with n=1.83. Ir(ppy)$_2$acac dipole alignment leads to 77% normal and 23% horizontal component emission (relative to the substrate plane). See, M. E. Thompson, et al., Nat. Mater. 2016, 15, 85. The thicknesses and refractive indices of each layer are: ITO, 70 nm thick, n=2.1, hole transport layer, 40 nm thick, n=1.70, electron transport layer, 65 nm thick, n=1.78, and Al cathode, n=0.6+2.8i. The parylene substrate index is n=1.64.

A scanning electron microscope (SEM) image of the Al cathode of the CP-OLED is shown in FIG. 3B. The random corrugated pattern originates from the rough surface of the unpolished metal oxide (in some embodiments, sapphire) substrate that transfers to the conformally deposited parylene film and subsequent layers of the OLED body. The transferred corrugation at the CP-OLED cathode has a surface roughness of R$_a$=0.65 μm, with peak-to-valley depth of 2 μm. The relatively spiky features on the unpolished sapphire mold are replaced by a smoothly corrugated profile of the CP-OLED due to the conformal nature of the parylene PVD process.

The following documents are incorporated herein by reference:

S. R. Forrest, Nature 428, 911 (2004).

G. Gu, P. E. Burrows, S. Venkatesh, S. R. Forrest, and M. E. Thompson, Opt. Lett. 22, 172 (1997).

Z. B. Wang, M. G. Helander, J. Qiu, D. P. Puzzo, M. T. Greiner, Z. M. Hudson, S. Wang, Z. W. Liu, and Z. H. Lu, Nat. Photonics 5, 753 (2011).

T.-H. Han, Y. Lee, M.-R. Choi, S.-H. Woo, S.-H. Bae, B. H. Hong, J.-H. Ahn, and T.-W. Lee, Nat. Photonics 6, 105 (2012).

L. H. Xu, Q. D. Ou, Y. Q. Li, Y. B. Zhang, X. D. Zhao, H. Y. Xiang, J. De Chen, L. Zhou, S. T. Lee, and J. X. Tang, ACS Nano 10, 1625 (2016).

L. Zhou, H.-Y. Xiang, S. Shen, Y.-Q. Li, J.-D. Chen, H.-J. Xie, I. A. Goldthorpe, L.-S. Chen, S.-T. Lee, and J.-X. Tang, ACS Nano 8, 12796 (2014).

R. Wang, L. H. Xu, Y. Q. Li, L. Zhou, C. Li, Q. D. Ou, J. De Chen, S. Shen, and J. X. Tang, Adv. Opt. Mater. 3, 203 (2015).

M. A. Baldo, D. F. O'Brien, Y. You, A. Shoustikov, S. Sibley, M. E. Thompson, and S. R. Forrest, Nature 395, 151 (1998).

C. Adachi, M. A. Baldo, M. E. Thompson, and S. R. Forrest, J. Appl. Phys. 90, 5048 (2001).

V. Bulovic, V. B. Khalfin, G. Gu, P. E. Burrows, D. Z. Garbuzov, and S. Forrest, Phys. Rev. B. Condens. Matter 58, 3730 (1998).

P. A. Hobson, S. Wedge, J. A. E. Wasey, I. Sage, and W. L. Barnes, Adv. Mater. 14, 1393 (2002).

S. Möller and S. R. Forrest, J. Appl. Phys. 91, 3324 (2002).

Y. Sun and S. R. Forrest, Nat Phot. 2, 483 (2008).

Y. Qu, J. Kim, C. Coburn, and S. R. Forrest, ACS Photonics 5, 2453 (2018).

J. Kim, Y. Qu, C. Coburn, and S. R. Forrest, ACS Photonics 5, 3315 (2018).

Y. Qu, M. Slootsky, and S. R. Forrest, Nat Phot. 9, 758 (2015).

W. H. Koo, S. M. Jeong, F. Araoka, K. Ishikawa, S. Nishimura, T. Toyooka, and H. Takezoe, Nat Phot. 4, 222 (2010).

Y. Qu, C. Coburn, D. Fan, and S. R. Forrest, ACS Photonics (2017).

M. J. Bak, M. Salcman, and E. M. Schmidt, IEEE Trans Biomed Eng., 121 (1977).

T. Yokota, P. Zalar, M. Kaltenbrunner, H. Jinno, N. Matsuhisa, H. Kitanosako, Y. Tachibana, W. Yukita, M. Koizumi, and T. Someya, Sci. Adv. (2016).

S. Park, S. W. Heo, W. Lee, D. Inoue, Z. Jiang, K. Yu, H. Jinno, D. Hashizume, M. Sekino, T. Yokota, K. Fukuda, K. Tajima, and T. Someya, Nature 561, 516 (2018).

J. Jean, A. Wang, and V. Bulović, Org. Electron. Physics, Mater. Appl. 31, 120 (2016).

J.-H. Lee and A. Kim, Org. Electron. 47, 147 (2017).

The disclosures of each and every patent, patent application, and publication cited herein are hereby incorporated herein by reference in their entirety. While devices and methods have been disclosed with reference to specific embodiments, it is apparent that other embodiments and variations of this disclosure may be devised by others skilled in the art without departing from the true spirit and scope of the disclosure. The appended claims are intended to be construed to include all such embodiments and equivalent variations.

The invention claimed is:

1. A light emitting device comprising:
a thin polymer substrate having a thickness in a range from 2 μm to 25 μm, and having an external surface and an opposite internal surface, wherein the external surface and the internal surface each has an arithmetic mean roughness $R_a$ in a range from 0.1 μm to 10 μm; and
a light emitting body disposed over the internal surface of the thin polymer substrate, the light emitting body comprising an anode, a cathode and at least one light emitting layer positioned between the anode and the cathode, wherein at least one of the anode, the cathode, and the at least one light emitting layer has an arithmetic mean roughness $R_a$ in a range from 0.1 μm to 10 μm.

2. The light emitting device of claim 1, further comprising a second thin polymer layer disposed over the light emitting body, opposite the thin polymer substrate.

3. The light emitting device of claim 1, wherein the thin polymer substrate comprises parylene.

4. The light emitting device of claim 1, wherein the external surface has a random corrugation pattern.

5. The light emitting device of claim 1, wherein the arithmetic mean roughness $R_a$ is in a range from 0.40 μm to 1.0 μm.

6. The light emitting device of claim 1, wherein the thin polymer substrate has a thickness in a range from 5 μm to 15 μm.

7. The light emitting device of claim 1, wherein the thin polymer substrate has a refractive index of between 1.5 and 1.8.

8. The light emitting device of claim 7, wherein the refractive index is between 1.6 and 1.7.

9. The light emitting device of claim 8, wherein the refractive index is about 1.64.

10. The light emitting device of claim 1, wherein the at least one light emitting layer includes a phosphorescent emitter compound doped into a host material, wherein the phosphorescent emitter compound has a peak light emission wavelength in a range from 490 nm to 650 nm.

11. The light emitting device of claim 1, wherein the light emitting layer includes a fluorescent emitter or a thermal-assisted delayed fluorescent emitter.

12. The light emitting device of claim 1, wherein the light emitting body is a white-light organic electroluminescent device.

13. The light emitting device of claim 1, wherein the light emitting body includes separate red and green light emitting elements.

14. The light emitting device of claim 1, wherein the anode comprises ITO and has a thickness of between 50 nm and 200 nm.

15. A consumer product that includes a light emitting device according to claim 1, wherein the consumer product is selected from the group consisting of a flat panel display, a computer monitor, a medical monitor, a television, a billboard, a light for interior or exterior illumination and/or signaling, a heads-up display, a fully or partially transparent display, a flexible display, a laser printer, a telephone, a cell phone, tablet, a phablet, a personal digital assistant (PDA), a wearable device, a laptop computer, a digital camera, a camcorder, a viewfinder, a micro-display that is less than 2 inches diagonal, a 3-D display, a virtual reality or augmented reality display, a vehicle, a video wall comprising multiple displays tiled together, a theater or stadium screen, a light therapy device, and a sign.

16. The light emitting device of claim 1, wherein each of the anode, the cathode, and the at least one light emitting layer has an arithmetic mean roughness $R_a$ in a range from 0.1 μm to 10 μm.

17. The light emitting device of claim 2, wherein the second thin polymer layer has an arithmetic mean roughness Rain a range from 0.1 μm to 10 μm.

* * * * *

UNITED STATES PATENT AND TRADEMARK OFFICE
CERTIFICATE OF CORRECTION

| | | |
|---|---|---|
| PATENT NO. | : 11,832,475 B2 | Page 1 of 1 |
| APPLICATION NO. | : 17/826722 | |
| DATED | : November 28, 2023 | |
| INVENTOR(S) | : Yue Qu, Xiaheng Huang and Stephen R. Forrest | |

It is certified that error appears in the above-identified patent and that said Letters Patent is hereby corrected as shown below:

In the Claims

Please correct Claim 17 to read:
17. The light emitting device of claim 2, wherein the second thin polymer layer has an arithmetic mean roughness $R_a$ in a range from 0.1 μm to 10 μm.

Signed and Sealed this
Twentieth Day of February, 2024

*Katherine Kelly Vidal*

Katherine Kelly Vidal
*Director of the United States Patent and Trademark Office*